(12) United States Patent
Lee et al.

(10) Patent No.: US 7,893,421 B2
(45) Date of Patent: Feb. 22, 2011

(54) PHASE CHANGE MEMORY DEVICE CAPABLE OF SATISFYING RESET CURRENT CHARACTERISTIC AND CONTACT RESISTANCE CHARACTERISTIC

(75) Inventors: Keum Bum Lee, Gyeonggi-do (KR); Hye Jin Seo, Gyeonggi-do (KR); Hyung Suk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/482,607

(22) Filed: Jun. 11, 2009

(65) Prior Publication Data
US 2010/0117044 A1    May 13, 2010

(30) Foreign Application Priority Data
Nov. 12, 2008    (KR) ...................... 10-2008-0112007

(51) Int. Cl.
*H01L 47/00*    (2006.01)

(52) U.S. Cl. ............ 257/4; 257/2; 257/3; 257/E21.001; 257/E21.068; 257/E21.589; 257/E47.001; 257/E47.005; 257/E45.002; 438/95

(58) Field of Classification Search .................... 257/2, 257/3, 4, E21.001, E21.068, E21.589, E47.001, 257/E47.005, E45.002; 438/95
See application file for complete search history.

(56) References Cited

U.S. PATENT DOCUMENTS

2006/0284237 A1*  12/2006  Park et al. .................... 257/314
2008/0121862 A1*  5/2008   Liu ................................ 257/4

FOREIGN PATENT DOCUMENTS

KR    1020060124290 A    12/2006

* cited by examiner

*Primary Examiner*—Benjamin P Sandvik
*Assistant Examiner*—Farid Khan
(74) *Attorney, Agent, or Firm*—Ladas & Parry LLP

(57) ABSTRACT

A phase change memory device is presented that has a lower electrode contact that has a gradient resistance profile ranging from a lower resistive lower end to a higher resistive upper end. The phase change memory device includes a semiconductor substrate, a lower electrode contact, and a phase change pattern. The semiconductor substrate has a switching device. The lower electrode contact is formed on the switching device and has a specific resistance which gradually increases from a lower part to an upper part of the lower electrode contact. The phase change pattern layer is formed on the lower electrode contact.

10 Claims, 5 Drawing Sheets

PHASE CHANGE MEMORY DEVICE CAPABLE OF SATISFYING RESET CURRENT CHARACTERISTIC AND CONTACT RESISTANCE CHARACTERISTIC

CROSS-REFERENCES TO RELATED APPLICATION

The present application claims priority under 35 U.S.C. 119(a) to Korean application number 10-2008-0112007, filed on Nov. 12, 2008, in the Korean Patent Office, which is incorporated by reference in its entirety as if set forth in full.

BACKGROUND OF THE INVENTION

1. Technical Field

A phase change memory device and a method for manufacturing the same are described. More particularly, the phase change memory device has a lower electrode contact structure that exhibits a gradient resistance for providing an efficient Joule heat source at the phase change components.

2. Related Art

Generally, a phase change material is understood herein to be a substance that can be induced to interconvert between various solid state phases, such as interconverting between an ordered crystalline solid state to a relatively disordered amorphous solid state as a function of temperature and/or as a function of a cooling annealing rate. Such a phase change of the phase change material is preferably able to be reversibly performed. The electrical resistance of the phase change material may vary as a function of which particular solid state phase the substance is composed. This dependence of the electrical resistance of these types of phase change materials can be exploited by incorporating these phase change materials into storage medium in memory devices. Currently, a number of studies have been pursued on how to best optimize the performance of phase change memory devices by using these types of phase change materials that exhibit changes to their respective physical properties, such as resistances, as a function of the temperature or as a function of the cooling or heating rates.

Typically, the phase change memory devices are configured to include a phase change material layer and a switching device that selectively provides current to the phase change material layer. A GST (Ge—Sb—Te) layer is often used as the phase change material layer, and a diode and a MOS transistor are often used as the switching device.

In addition, the phase change memory device often includes a heating electrode for use in heating the phase change material layer by applying an electrical current thereto. The characteristics of the heating electrode are very important in how the phase change memory device will perform. The heating electrode is used to apply a reset current which induces heating (i.e., Joule heat) into the GST (Ge—Sb—Te) layer. It is known that the reset current exerts an influence on a life-time (i.e., the reversibility of the memory cell), a sensing margin and a size of the device. For this reason, it is important to strive to ensure optimal device characteristics by carefully controlling the amount of the reset current.

In order to satisfy such characteristics, a lower electrode contact serving as the heating electrode preferably needs to make contact with the switching device in a relatively large area while making contact with the phase change material layer in a relatively small area.

However, in conventional phase change memory devices, the lower electrode contact simply has a cylindrical shape. As a result the contact area with respect to the switching device is proportional to the contact area with respect to the phase change material layer. Therefore the lower electrode contact of the conventional phase change memory device hardly satisfies the specific optimal resistance characteristics and the respective switching speed is likely to be relatively slow.

In addition, in order to satisfy the above requirements, the lower electrode contact must be deformed. As a result the manufacturing process can become very complicated.

SUMMARY OF THE INVENTION

A phase change memory device, capable of improving a reset current characteristic and a method for manufacturing the same are described herein.

According to an aspect, a phase change memory device includes a semiconductor substrate provided with a switching device, a lower electrode contact, which is formed on the switching device and which has a specific resistance that gradually increases from a lower part to an upper part of the lower electrode contact, and a phase change pattern layer formed on the lower electrode contact.

According to another aspect, a method for manufacturing a phase change memory device includes providing a semiconductor substrate, forming a first interlayer dielectric layer, which includes a switching device, on the semiconductor substrate, forming a second interlayer dielectric layer having a lower electrode contact hole on the first interlayer dielectric layer, forming a lower electrode contact having a specific resistance, which gradually increases from a lower part to an upper part of the lower electrode contact, in the contact hole, and forming a phase change pattern on the lower electrode contact.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
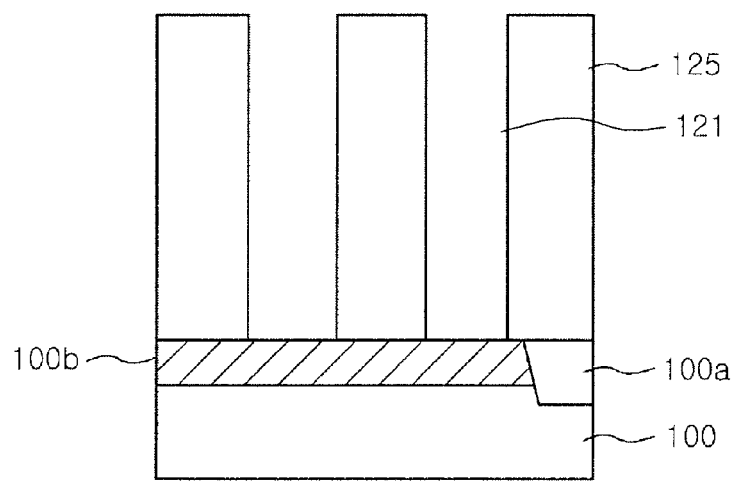
FIGS. 1 to 10 are sectional views showing a method for manufacturing a phase change memory device according to one embodiment. It is understood herein that the drawings are not necessarily to scale and in some instances proportions may have been exaggerated in order to more clearly depict certain features of the invention.

Referring now to FIG. 1, in order to define an active area of a phase change memory device, an isolation layer 100*a* is shown formed on a predetermined area of a semiconductor substrate 100 by performing a conventional STI (Shallow Trench Isolation) process. The semiconductor substrate 100 may be any type of semiconductor substrate such as a silicon substrate that has an initial excess of p-type impurities.

Additional impurities, for example, n-type impurities are then subsequently implanted onto the active area of the semiconductor substrate 100 to form an impurity area 100*b* that can serve as a word line of the phase change memory device.

A first interlayer dielectric layer 125 is subsequently formed over the semiconductor substrate 100. Afterwards a contact hole 121 is then formed along a predetermined portion of the first interlayer dielectric layer 125 to expose a portion of the impurity area 100b. The first interlayer dielectric layer 125 can be formed by using any number of well known fabrication techniques such as CVD (Chemical Vapor Deposition), LPCVD (Low Pressure Chemical Vapor Deposition), PECVD (Plasma Enhanced Chemical Vapor Deposition), PVD (Physical Vapor Deposition) and ALD (Atomic Layer Deposition). The first interlayer dielectric layer 125 may include any number of dielectric materials such as those selected from the group consisting of HDP (High Density Plasma) oxide layer, BPSG (Boron Phosphorus Silicate Glass) layer, PSG (Phosphorus Silicate Glass) layer, PETEOS (Plasma Enhanced Tetra Ethyle Ortho Silicate) layer, USG (Un-doped Silicate Glass) layer, FSG (Fluorinated Silicate Glass) layer, CDO (Carbon Doped Oxide) layer and OSG (Organo Silicate Glass) layer. The first interlayer dielectric layer 125 may also be formed by stacking at least two different types of dielectric layers together. In addition, the first interlayer dielectric layer 125 can be any thickness, in which one preferable thickness of the interlayer dielectric layer 125 is that it is between 5000 to 5500 Å.

Figure 2:
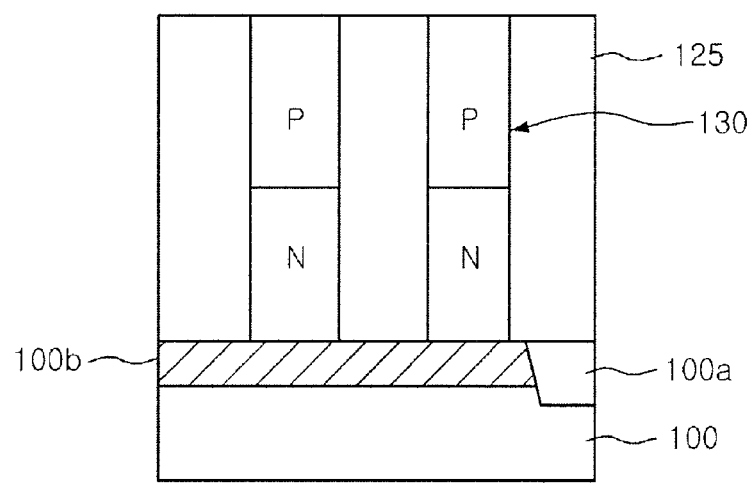

Referring now to FIG. 2, a PN diode 130 is shown formed in the contact hole 121 (see, FIG. 1) which serves as a switching device. The PN diode 130 can be formed by any known conventional scheme. One preferred technique to form the PN diode 130 comprises forming an n-type SEG (Selective Epitaxial Growth) layer to fill in the contact hole 121. Then, the SEG layer and the first interlayer dielectric layer 125 are polished down by a predetermined thickness, preferably using CMP (Chemical Mechanical Polishing). Afterwards the n-type SEG layer is implanted with an excess of p-type dopants.

Figure 3:
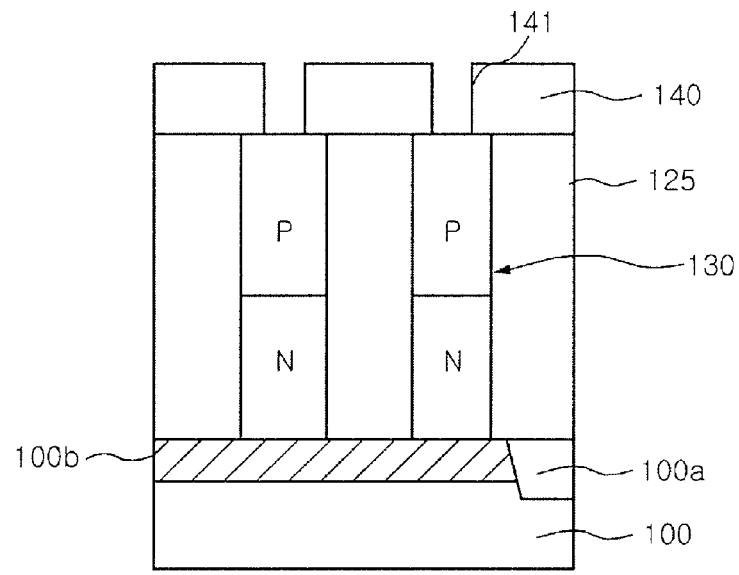

Then, as shown in FIG. 3, a second interlayer dielectric layer 140 is formed over the semiconductor substrate 100 having a predetermined thickness. The second interlayer dielectric layer 140 may be made of any type of dielectric material, however a silicon nitride layer is preferred because it exhibits superior dielectric properties for use as the second interlayer dielectric layer 140. Afterwards the second interlayer dielectric layer 140 is subsequently etched so that an upper part of the switching device 130 is exposed in order to form a lower electrode contact hole 141. In this situation, the second interlayer dielectric layer 140 can be made thinner than that the first interlayer dielectric layer 125. For example, the second interlayer dielectric layer 140 is deposited to have a thickness of about 1000 to 1500 Å, and the lower electrode contact hole 141 has a CD (Critical Dimension) of about 55 to 70 nm.

Figure 4:
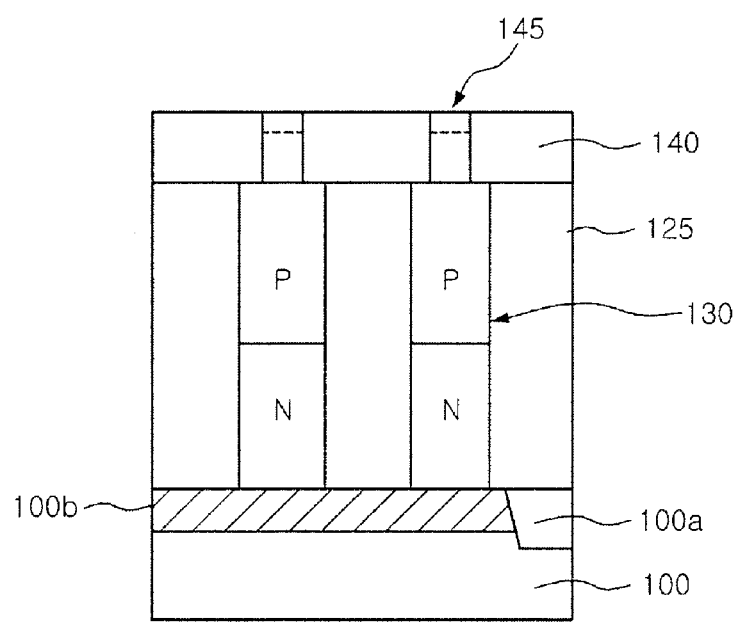

As shown in FIG. 4, a lower electrode contact 145 is formed in the lower electrode contact hole 141 in such a manner that specific resistance of the lower electrode contact 145 gradually increases from a lower part to an upper part of the lower electrode contact 145. As well known, the lower electrode contact 145 can be interpreted as a lower electrode of the phase change memory device.

Figure 5:
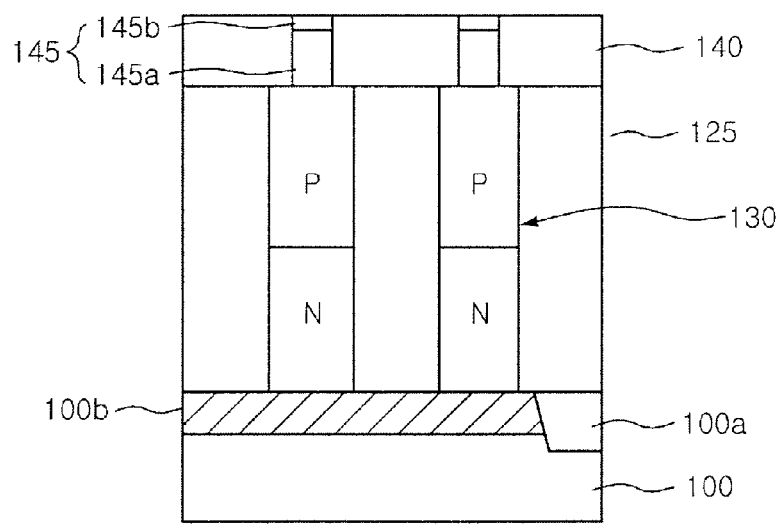

As shown in FIG. 5, the lower electrode contact 145 having a specific resistance, as described above, can be made of a multilayered structure which includes a crystalline SiGe SEG layer 145a and an amorphous SiGe SEG layer 145b. As a generally rule, an amorphous solid state structure is expected to exhibit a resistance higher than that of its corresponding analogous crystalline solid state structure. Accordingly, when the lower electrode contact is formed with a lower part made of a crystalline SiGe SEG layer 145a and an upper part made of an amorphous SiGe SEG layer 145b, then the resistance of the lower electrode contact 145 increases from the lower part to the upper part of the lower electrode contact 145. The term "amorphous" is understood herein to be a solid-state phase that exhibits little or no ordered atomic organization in the solid-state phase lattice. The term "crystalline" is understood herein to be a solid-state phase that exhibits an ordered atomic organization in the solid-state phase lattice.

When taking current transfer characteristics into consideration for designing preferred dimensions of the lower electrode contact 145, then the crystalline SiGe SEG layer 145a is preferred to be thicker than the amorphous SiGe SEG layer 145b. For example, if the lower electrode contact 145 has a total height of about 800 to 1200 Å, then the crystalline SiGe SEG layer 145a would be preferred to have a height of about 700 to 1000 Å, respectively.

The crystalline SiGe SEG layer 145a and the amorphous SiGe SEG layer 145b can be formed by any number of fabrication techniques. One preferred technique is to exploit a difference in the deposition temperature in building these layers. That is, it is preferred that the crystalline SiGe SEG layer 145a is deposited at about 650 to 700° C., and the amorphous SiGe SEG layer 145b is deposited at a lower temperature range of about below 500 to 650° C.

The process pressure for forming the lower electrode contact 145 is preferred to be between about 5 to 10 Torr. HCl gas is preferably used to promote the generation of dangling bonds (i.e., HCl gas is used as a dangling bond source gas) when growing the respective SEG layers.

In addition, selectively growing crystalline SiGe SEG layer 145a and amorphous SiGe SEG layer 145b can be influenced by controlling the relative amounts of the dangling bond source gas during the growth process. That is, when a relatively large amount of the dangle bond source gas is provided, it is believed that the relative number of dangle bonds is increased in which single crystalline SEG layer can be grown more efficiently than amorphous SEG layer. In contrast, when a relatively small amount of the dangle bond source gas is provided, it is believed that the relative number of the dangle bonds is reduced in which amorphous SEG layer is favored to be grown.

According to the presently used growth chambers, about 300 to 350 cc of HCl is preferred to be supplied when growing the crystalline SiGe SEG layer 145a. Then, the HCl gas can be adjusted downwards to a range of 100 to 350 cc when growing the amorphous SiGe SEG layer 145b. In addition, the HCl gas can also be used to increase the growth speed of the SiGe SEG layer 145. Although the HCl gas is used as the dangling bond source gas, this is not the only dangling bond source gas limited thereto. According to another dangling bond source gas can be a mixture of $Cl_2$ gas, DCS (dichloro silane) and HCl gas can also be used as the dangling bond source gas.

Figure 6:
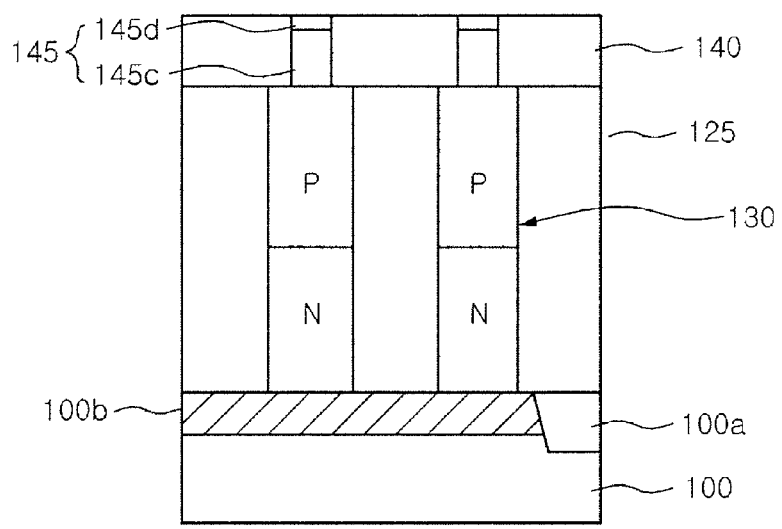

Meanwhile, as shown in FIG. 6, the lower electrode contact 145 according to yet another variation is that the lower electrode contact 145 can include a conductive layer 145c having a first impurity density and a conductive layer 145d having a second impurity density lower than the first impurity density. Similar to the previous embodiment, the conductive layers may simply be composed of SiGe SEG layers. That is, the lower electrode contact 145 can include a SiGe SEG layer 145c having the first impurity density and a SiGe SEG layer 145d having the second impurity density which is lower than the first impurity density. The impurities can be any type of impurities in which it is preferred that the impurities are p-type impurities, for example, boron. The SiGe SEG layer 145d can be fabricated as an impurity-free SiGe SEG layer (i.e., intrinsic). The impurity-free SiGe SEG layer is understood herein to have no additional impurity elements added to the layer and is understood to only have intrinsic levels of trace constituents. In addition, the SiGe SEG 145c having the first impurity density can be composed of a crystalline SiGe SEG layer, and the SiGe SEG layer 145d can be composed of either a crystalline SiGe SEG layer or an amorphous SiGe SEG layer.

Figure 7:
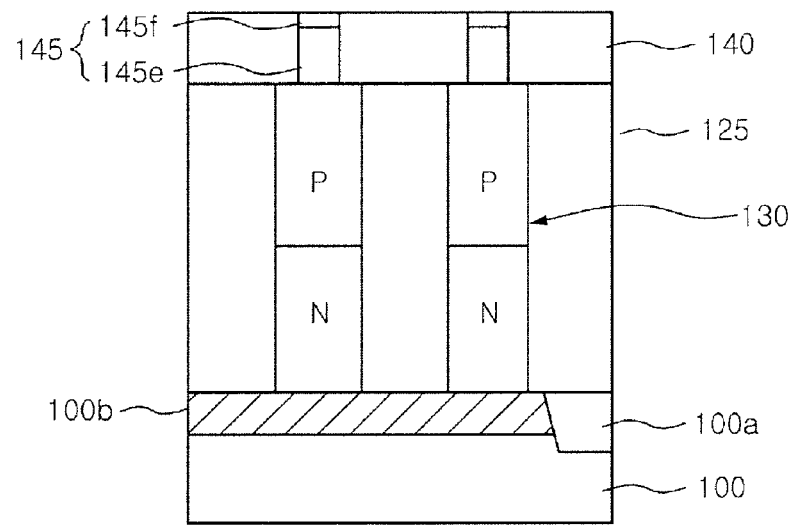

In addition, as shown in FIG. 7, according to another variation, the lower electrode contact 145 can be realized as a multilayer structure which includes a germanium-rich SiGe SEG layer 145e and a silicon-rich SiGe SEG layer 145f. The silicon-rich SiGe SEG layer 145f is understood herein to have a $Si_xGe_{(1-x)}$ stoichiometry such that the x subscript is greater than about 0.55. The germanium-rich SiGe SEG layer 145e is understood herein to have a $Si_xGe_{(1-x)}$ stoichiometry such that the x subscript is less than about 0.45.

As generally understood, the germanium (Ge) bandgap is about 0.66 eV, which is narrower than the bandgap (1.1 eV) of silicon. Therefore, germanium is expected to more easily conduct than that of silicon. Accordingly, when the relative abundance of germanium increase in SiGe, then the specific resistance is expected to become lower. In addition, since the germanium is activated at the temperature of about 400° C., then germanium exhibits conductivity superior to that of the silicon, in which silicon is activated at the temperature of about 700° C.

That is, a resistance difference between an upper SEG layer and a lower SEG layer of the lower electrode contact 145 can also be achieved by changing the dose of germanium source or silicon source implanted onto a crystalline or amorphous SiGe SEG layer initially having a constant stoichiometic ratio.

Figure 8:
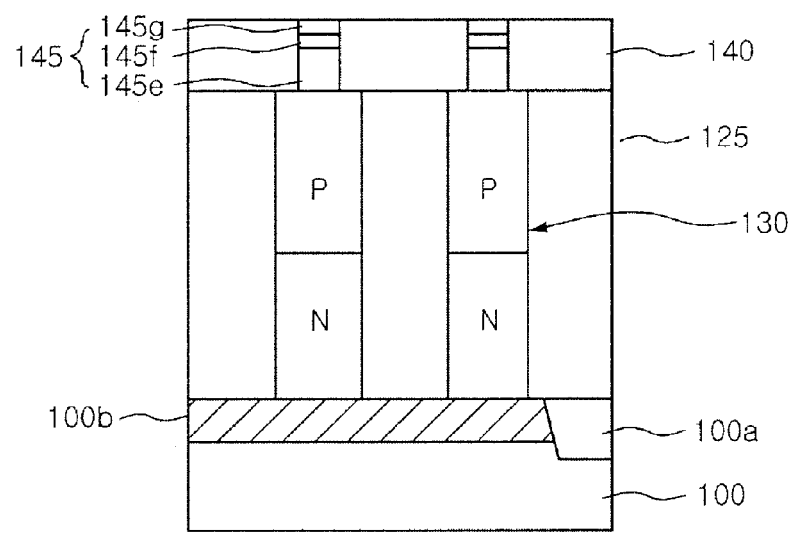

In addition, as shown in FIG. 8, a SiGe SEG layer 145g having a normal stoichiometric ratio of the can be further formed on the silicon-rich SiGe SEG layer 145f for minimizing or preventing out-diffusion of excessive silicon diffusing away from the silicon-rich SiGe SEG layer 145f. The normal stoichiometric ratio of the silicon-rich SiGe SEG layer 145f is understood herein to have a $Si_xGe_{(1-x)}$ stoichiometry such that $0.45<x<0.55$.

Figure 9:
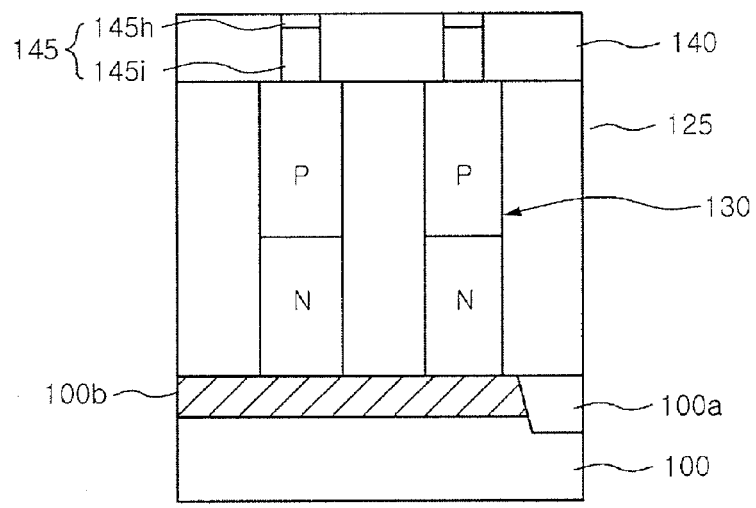

As shown in FIG. 9, the lower electrode contact 145 according to yet another embodiment can be realized as a multilayer composed of a crystalline SiGe SEG layer 145i and a Si SEG layer 145h.

As is generally understood, a Si SEG layer 145h would be expected to exhibit a higher specific resistance than that of a SiGe SEG layer 145i. For this reason, when the Si SEG 145h is formed on the SiGe SEG 145i, then the contact resistance increases from the lower part to the upper part of the lower electrode contact 145.

Such a lower electrode contact 145 having the above structure can be obtained by forming the crystalline SiGe SEG layer 145i and the amorphous Si SEG layer 145h in a state that the process temperature is fixed in the range of about 600 to 650° C.

When forming the SiGe SEG, $GeH_4$ gas is preferably used as the germanium source gas, and the silicon source gas may be any silicon source gas such as DCS (dichlorosilane: $SiH_2Cl_2$), $SiH_4$ and $Si_2H_6$.

Figure 10:
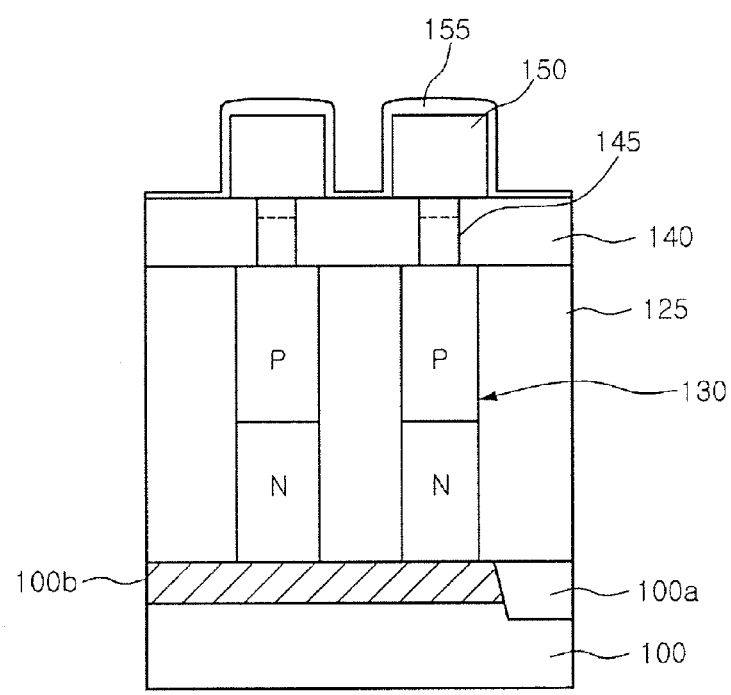

As shown in FIG. 10, a phase change pattern 150 is formed over the second interlayer dielectric layer 140 having the lower electrode contact 145 such that the phase change pattern 150 makes contact with the lower electrode contact 145. Afterwards, a capping layer 155 is formed over the semiconductor substrate 100 having the phase change pattern 150.

According to the lower electrode contact 145 of one embodiment, the lower electrode contact 145 has relatively low resistance with respect to the PN diode 130, which means that the contact resistance with respect to the PN diode 130 can be reduced. In addition, the lower electrode contact 145 has a relatively high resistance with respect to the phase change pattern 150, which means that the amount of heat generated from the phase change pattern 150 can be increased. As a result of this configuration, one can efficiently induce a phase change in the phase change pattern 150 by generating Joule heat (i.e., also known as ohmic heat or resistive heat) from an induced current at the contact area between the phase change pattern 150 and the lower electrode contact 145. Also as a result, current loss can be reduced and reset current can be lowered.

In addition, conventional lower electrode contacts are often formed by using a metal layer in order to provide an ohmic contact layer formed on the PN diode 130. In contrast, the present application envisions that the lower electrode contact 145 contacting the PN diode 130 can be formed from SEG in which this additional ohmic contact layer forming step can be omitted.

In addition, according to the lower electrode contact 145 having the above structure, even if an aspect ratio of the lower electrode contact 145 is reduced to 0.7 or less, the reset current may have a lower level (e.g., 0.8 mA) than the level of the conventional reset current (e.g., 1.2 mA). Likewise, the reset voltage can also be substantially reduced, for example to a reset voltage level of about 1.8V.

It is understood, that the present invention is not limited to the above-mentioned embodiments and that the above-mentioned embodiments are for allowing the reader to more easily understand what is being described and claimed.

For example, although the present embodiment has been described in that the lower electrode contact includes the SiGe SEG layer or the Si SEG layer as a representative example, the present invention is not limited thereto. According to another embodiment, the lower electrode contact may include other material suitable for forming the SEG layer.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A phase change memory device comprising:
    a semiconductor substrate provided with a switching device;
    a lower electrode contact formed over the switching device, the lower electrode contact having a specific resistance which increases from a lower part to an upper part of the lower electrode contact; and
    a phase change pattern layer formed on the lower electrode contact,
    wherein the lower electrode contact includes:
    a crystalline conductive layer formed over the switching device; and
    an amorphous conductive layer formed over the crystalline conductive layer.

2. The phase change memory device of claim 1, wherein the crystalline and amorphous conductive layers each comprise an SEG (Selective Epitaxial Growth) layer.

3. The phase change memory device of claim 1, wherein the crystalline conductive layer is thicker than the amorphous conductive layer.

4. A phase change memory device comprising:
    a semiconductor substrate provided with a switching device;

a lower electrode contact formed over the switching device, the lower electrode contact having a specific resistance which increases from a lower part to an upper part of the lower electrode contact; and a phase change pattern layer formed on the lower electrode contact, wherein the lower electrode contact includes:

a first SEG (Selective Epitaxial Growth) layer formed over the switching device, the first SEG layer having conductive impurities at a first density; and a second SEG layer formed on the first SEG layer, wherein the second SEG layer has conductive impurities at a second density such that the second density is less than the first density.

5. The phase change memory device of claim 4, wherein the conductive impurities are p-type impurities.

6. The phase change memory device of claim 4, wherein the second SEG layer is undoped and only has intrinsic levels of conductive impurities.

7. The phase change memory device of claim 4, wherein the first SEG layer is thicker than the second SEG layer.

8. A phase change memory device comprising:

a semiconductor substrate provided with a switching device;

a lower electrode contact formed over the switching device, the lower electrode contact having a specific resistance which increases from a lower part to an upper part of the lower electrode contact; and a phase change pattern layer formed on the lower electrode contact, wherein the lower electrode contact comprises:

a germanium-rich SiGe SEG (Selective Epitaxial Growth) layer formed over the switching device wherein the germanium-rich SiGe SEG layer comprises a $Si_xGe_{(1-x)}$ stoichiometric ratio where x<0.45; and a silicon-rich SiGe SEG layer formed over the germanium-rich SiGe SEG wherein the silicon-rich SiGe SEG layer comprises a $Si_xGe_{(1-x)}$ stoichiometric ratio where x>0.55.

9. The phase change memory device of claim 8, further comprising a normal SiGe SEG layer formed over the silicon-rich SiGe SEG layer, wherein the normal SiGe SEG layer having a stoichiometric ratio of $Si_xGe_{1-x}$ where x is between 0.45 and 0.55.

10. A phase change memory device comprising:

a semiconductor substrate provided with a switching device;

a lower electrode contact formed over the switching device, the lower electrode contact having a specific resistance which increases from a lower part to an upper part of the lower electrode contact; and a phase change pattern layer formed on the lower electrode contact, wherein the lower electrode contact comprises:

a SiGe SEG (Selective Epitaxial Growth) layer formed over the switching device; and a Si SEG layer formed over the SiGe SEG layer.

* * * * *